(12) United States Patent
Matano et al.

(10) Patent No.: US 10,329,428 B2
(45) Date of Patent: Jun. 25, 2019

(54) RESIN COMPOSITION FOR THREE-DIMENSIONAL MODELING, METHOD FOR MANUFACTURING THREE-DIMENSIONAL MODELED OBJECT, AND INORGANIC FILLER PARTICLES

(71) Applicant: NIPPON ELECTRIC GLASS CO., LTD., Otsu-shi, Shiga (JP)

(72) Inventors: Takahiro Matano, Otsu (JP); Shunsuke Fujita, Otsu (JP); Shingo Nakane, Otsu (JP); Yuji Ishida, Otsu (JP); Yoshinori Yamazaki, Otsu (JP)

(73) Assignee: NIPPON ELECTRIC GLASS CO., LTD., Otsu-shi, Shiga (JP)

( * ) Notice: Subject to any disclaimer, the term of this patent is extended or adjusted under 35 U.S.C. 154(b) by 0 days.

(21) Appl. No.: 15/525,391

(22) PCT Filed: Nov. 4, 2015

(86) PCT No.: PCT/JP2015/081073
§ 371 (c)(1),
(2) Date: May 9, 2017

(87) PCT Pub. No.: WO2016/076180
PCT Pub. Date: May 19, 2016

(65) Prior Publication Data
US 2017/0321056 A1 Nov. 9, 2017

(30) Foreign Application Priority Data

Nov. 12, 2014 (JP) .................... 2014-229984

(51) Int. Cl.
| | | |
|---|---|---|
| *B33Y 70/00* | (2015.01) | |
| *B33Y 10/00* | (2015.01) | |
| *C03C 3/097* | (2006.01) | |
| *C08F 2/44* | (2006.01) | |
| *C08K 3/40* | (2006.01) | |
| *G03F 7/027* | (2006.01) | |
| *C08L 101/12* | (2006.01) | |
| *C03C 3/087* | (2006.01) | |
| *G03F 7/00* | (2006.01) | |
| *C03C 3/078* | (2006.01) | |
| *C03C 3/089* | (2006.01) | |
| *C03C 3/091* | (2006.01) | |
| *C03C 3/093* | (2006.01) | |
| *C03C 3/095* | (2006.01) | |
| *C03C 3/118* | (2006.01) | |
| *G03F 7/004* | (2006.01) | |
| *G03F 7/038* | (2006.01) | |
| *B29C 64/135* | (2017.01) | |

(52) U.S. Cl.
CPC ............ *C08L 101/12* (2013.01); *B33Y 10/00* (2014.12); *B33Y 70/00* (2014.12); *C03C 3/078* (2013.01); *C03C 3/087* (2013.01); *C03C 3/089* (2013.01); *C03C 3/091* (2013.01); *C03C 3/093* (2013.01); *C03C 3/095* (2013.01); *C03C 3/097* (2013.01); *C03C 3/118* (2013.01); *C08F 2/44* (2013.01); *C08K 3/40* (2013.01); *G03F 7/0037* (2013.01); *G03F 7/0047* (2013.01); *G03F 7/027* (2013.01); *G03F 7/038* (2013.01); *B29C 64/135* (2017.08); *C08K 2201/016* (2013.01)

(58) Field of Classification Search
CPC ....... B29C 64/135; B33Y 10/00; B33Y 70/00; C03C 3/078; C03C 3/087; C03C 3/089; C03C 3/091; C03C 3/093; C03C 3/095; C03C 3/097; C03C 3/118; C08F 2/44; C08K 3/40; C08L 101/12; G03F 7/0037; G03F 7/0047; G03F 7/027; G03F 7/038
See application file for complete search history.

(56) References Cited

U.S. PATENT DOCUMENTS

| | | | |
|---|---|---|---|
| 5,679,722 A | 10/1997 | Tamura | |
| 1,443,636 A1 | 9/2003 | Ueno | |
| 1,606,600 A1 | 7/2004 | Shibahara et al. | |
| 1,649,966 A1 | 9/2005 | Shibahara et al. | |
| 2004/0126592 A1* | 7/2004 | Shibahara | C08K 3/40 428/441 |
| 2005/0203239 A1* | 9/2005 | Shibahara | C08J 5/08 524/494 |

(Continued)

FOREIGN PATENT DOCUMENTS

| | | |
|---|---|---|
| CN | 1443636 A | 9/2003 |
| CN | 1606600 A | 4/2005 |
| CN | 1649966 A | 8/2005 |

(Continued)

OTHER PUBLICATIONS

JP 2011105555 A, Jun. 2011, Machine translation.*
https://www-03.ibm.com/procurement/proweb.nsf/objectdocswebview/file2011+ibm+pcb+symposium+nittobo/$file/ibm+pcb+symposium+nittobo.pdf, 2011.*
Wallenger et al., Glass Fibers, 2001, Composites, vol. 21.*
JP-2001261933-A, Sep. 2001, Derwent Ab.*
Office Action dated May 9, 2018 in Chinese Patent Application No. 201580061193.4 (7 pages) with an English translation (7 pages).

*Primary Examiner* — Satya B Sastri
(74) *Attorney, Agent, or Firm* — Drinker Biddle & Reath LLP

(57) ABSTRACT

Provided is a resin composition for three-dimensional modeling to which inorganic filler particles of a sufficient amount can be added, without damaging transparency. The resin composition for three-dimensional modeling includes a curable resin and inorganic filler particles, in which the inorganic filler particles are light-transmitting particles of which a difference in refractive index nd to the curable resin after curing is ±0.02 or less, and a difference in Abbe number vd to the curable resin after curing is ±10 or less.

9 Claims, No Drawings

(56) References Cited

U.S. PATENT DOCUMENTS

2007/0112123 A1     5/2007  Sekine
2014/0066561 A1 *   3/2014  Pfleghar .................... C08K 7/14
                                                           524/407

FOREIGN PATENT DOCUMENTS

| JP | H07-26060   | A   | 1/1995  |
| JP | H07-228644  | A   | 8/1995  |
| JP | 2001261933  | A * | 9/2001  |
| JP | 2006-312706 | A   | 11/2006 |
| JP | 2007-153729 | A   | 6/2007  |
| JP | 2008-224804 | A   | 9/2008  |
| JP | 2008-308629 | A   | 12/2008 |
| JP | 2011-105555 | A   | 6/2011  |
| JP | 2011105555  | A * | 6/2011  |
| JP | 2013-067519 | A   | 4/2013  |

* cited by examiner

RESIN COMPOSITION FOR THREE-DIMENSIONAL MODELING, METHOD FOR MANUFACTURING THREE-DIMENSIONAL MODELED OBJECT, AND INORGANIC FILLER PARTICLES

TECHNICAL FIELD

The present invention relates to a resin composition for three-dimensional modeling, a method for manufacturing a three-dimensional modeled object using the same, and inorganic filler particles.

BACKGROUND ART

In the past, a method for obtaining a three-dimensional modeled object by stacking a resin material and the like has been known. For example, various methods such as a stereolithography, a powder sintering method, and a fused deposition modeling (FDM) method are proposed, and are practically utilized.

For example, the stereolithography is excellent in fine modeling and accurate size expression, and is widely spread. The method makes a three-dimensional modeled object as follows. First, a modeling stage is mounted within a tank which is filled with a liquid photocurable resin, and a cured layer of a desired pattern is made by irradiating the photocurable resin on the modeling stage with an ultraviolet laser. The cured layer of one layer is made in this way, and then the modeling stage is lowered as a degree of one layer, an uncured resin is introduced onto the cured layer, and a new cured layer is stacked up on the cured layer by irradiating the photocurable resin with the ultraviolet laser in the same manner. By repeating the operation, a three-dimensional modeled object is obtained. Moreover, in the powder sintering method, a modeling stage is mounted within a tank which is filled with powder of resin, metal, ceramic or glass, and the powder on the modeling stage is irradiated with a laser of a semiconductor or the like, and a cured layer of a desired pattern is manufactured by softening and deforming.

PRIOR ART DOCUMENT

Patent Document

Patent Document 1: JP-A-7-26060

SUMMARY OF THE INVENTION

The Problems that the Invention is to Solve

A three-dimensional modeled object made of resin that is manufactured by the stereolithography or the like is pointed out to be fine and precise, but to be poor in mechanical strength or the like. In this case, it is proposed to add an inorganic filler to the photocurable resin, as proposed in Patent Document 1.

However, in the case where inorganic filler particles are added, there is a defect that it is not possible to add the inorganic filler particles of a sufficient amount since the photocurable resin is unlikely to be sufficiently irradiated with ultraviolet rays due to presence of the inorganic filler particles. Moreover, there is a problem that transparency of the obtained three-dimensional modeled object is deteriorated.

An object of the present invention is to provide a resin composition for three-dimensional modeling to which inorganic filler particles of a sufficient amount can be added, without deteriorating transparency.

Means for Solving the Problems

According to the present invention, there is provided a resin composition for three-dimensional modeling, including a curable resin and inorganic filler particles, in which the inorganic filler particles are light-transmitting particles of which a difference in refractive index nd to the curable resin after curing is ±0.02 or less, and a difference in Abbe number vd to the curable resin after curing is ±10 or less. Here, "refractive index nd" is a value which is measured with respect to d-line (587.6 nm) of a helium lamp, and "Abbe number vd" is a value which is calculated from a formula of Abbe number $(vd)=[(nd-1)/(nF-nC)]$, by using the refractive index of the d-line, and the refractive indexes of F-line (486.1 nm) and C-line (656.3 nm) of a hydrogen lamp. In the present invention, "light-transmitting" means that light transmittance of any wavelength is 10% or more in a range of visible rays.

According to the above configuration, since the light-transmitting particles of which an optical constant is matched with that of the curable resin after curing are used, light scattering which occurs at an interface between the curable resin and the inorganic filler particles is prevented, and the transparency of the obtained three-dimensional modeled object is not deteriorated. In a case where the stereolithography is used, the irradiation with an active energy ray is not disturbed by the inorganic filler particles. Therefore, it is possible to introduce a large amount of the inorganic filler particles into the curable resin, and it is possible to obtain the three-dimensional modeled object with high mechanical strength.

In the present invention, in the resin composition for three-dimensional modeling including a curable resin and inorganic filler particles, it is preferable that maximum transmittance Tmax after the curing is 10% or more. Here, "maximum transmittance Tmax after curing" means the maximum transmittance in a composite body after curing the inorganic filler particles and the curable resin. In the present invention, the transmittance means transmittance at a thickness of 1 mm in a range which is from a wavelength of 400 nm to a wavelength of 800 nm.

According to the above configuration, it is possible to obtain the three-dimensional modeled object with high transparency.

In the present invention, the resin composition for three-dimensional modeling including a curable resin and inorganic filler particles is provided, and it is preferable that a ratio Tmax/Tmin of maximum transmittance Tmax to minimum transmittance Tmin after curing is 20 or less. Here, "minimum transmittance Tmin" means the minimum transmittance in the composite body after curing the inorganic filler particles and the curable resin. "Ratio Tmax/Tmin" means a value which is obtained by dividing the maximum transmittance Tmax by the minimum transmittance Tmin.

According to the above configuration, the light scattering is lowered by the light-transmitting particles of which the optical constant is matched with that of the curable resin after curing, and thereby, it is possible to obtain the high transmittance in a wide range of a visible area, and it is possible to obtain the three-dimensional modeled object of small coloring.

In the present invention, it is preferable that the curable resin is a liquid photocurable resin.

According to the above configuration, it is possible to use the stereolithography for manufacturing of the three-dimensional modeled object.

In the present invention, it is preferable that the refractive index nd of the light-transmitting particles is 1.40 to 1.90, and the Abbe number vd of the light-transmitting particles is 20 to 65.

According to the above configuration, the optical constant is likely to be matched with that of the curable resin.

In the present invention, it is preferable that the light-transmitting particles are glass beads. In the present invention, "glass beads" means glass particles which are formed into a sphere shape, but are not necessarily accurate sphere shapes.

According to the above configuration, the transparency of the three-dimensional modeled object is not deteriorated. In a case where the stereolithography is used, liquidity of the curable resin is unlikely to be deteriorated.

In the present invention, it is preferable that the glass beads having a glass composition in which a total amount of $Fe_2O_3$, $NiO$, $Cr_2O_3$, and $CuO$ is 1 mass % or less are used.

According to the above configuration, since the coloring of the glass beads is likely to be prevented, it is possible to easily obtain the colorless and transparent three-dimensional modeled object.

In the present invention, it is preferable that the light-transmitting particles are glass particles containing, in terms of mass %, $SiO_2$ of 40 to 80%, $Al_2O_3$ of 0 to 30%, $B_2O_3$ of 0 to 20%, $CaO$ of 0 to 25%, $Na_2O$ of 0 to 30%, $K_2O$ of 0 to 30%, $Li_2O$ of 0 to 10%, $TiO_2$ of 0 to 15%, $Nb_2O_5$ of 0 to 20%, $WO_3$ of 0 to 20%, and F of 0 to 10%.

According to the above configuration, the inorganic filler particles having the optical constant which is suitable for the curable resin to be used is likely to be adopted.

According to the present invention, there is provided a method for manufacturing a three-dimensional modeled object including: selectively irradiating a liquid layer containing a resin composition with an active energy ray to form a cured layer having a pattern; and forming a new liquid layer on the cured layer and thereafter irradiating the new liquid layer with an active energy ray to form a new cured layer having a pattern continuous with the cured layer, stacking of cured layers being repeated to obtain a three-dimensional modeled object, in which the resin composition for three-dimensional modeling described above is used as a resin composition.

According to the above configuration, it is possible to obtain the transparent three-dimensional modeled object with high mechanical strength.

According to the inorganic filler of the present invention, there are provided inorganic filler particles which are used by being mixed with a curable resin, including glass containing, in terms of mass %, $SiO_2$ of 40 to 80%, $Al_2O_3$ of 0 to 30%, $B_2O_3$ of 0 to 20%, $CaO$ of 0 to 25%, $Na_2O$ of 0 to 30%, $K_2O$ of 0 to 30%, $Li_2O$ of 0 to 10%, $TiO_2$ of 0 to 15%, $Nb_2O_5$ of 0 to 20%, $WO_3$ of 0 to 20%, and F of 0 to 10%.

Embodiments for Carrying Out the Invention

A resin composition for three-dimensional modeling of the present invention includes a curable resin, and inorganic filler particles. In a mixing proportion of the curable resin and the inorganic filler particles, the curable resin is preferably 30 to 99%, and the inorganic filler particles are preferably 1 to 70%, by volume %. The curable resin is more preferably 35 to 95%, and 40 to 90%, and particularly preferably 45 to 85%, and the inorganic filler particles are more preferably 5 to 65%, and 10 to 60%, and particularly preferably 15 to 55%. If the proportion of the inorganic filler particles is too high, the surface area which adheres to the resin becomes small, and mechanical strength becomes low. In a case where a stereolithography is used, generated is a defect such that viscosity of the curable resin becomes too high, and a new liquid layer is unlikely to be formed on a modeling stage. If the proportion of the curable resin is too high, strength and hardness of a glass filler is unlikely to be reflected to a composite. Moreover, since the content of the inorganic filler particles is relatively lowered, the mechanical strength of the modeled object is lowered.

The curable resin which is used in the present invention may be any of a photocurable resin and a thermocurable resin, and can be appropriately selected by the adopted modeling method. For example, in a case where the stereolithography is used, a liquid photocurable resin may be selected, and in a case where a powder sintering method is adopted, a powdered thermocurable resin may be selected.

For example, as a photocurable resin, various resins such as a polymerizable vinyl compound and an epoxy compound can be selected. Moreover, a monomer or an oligomer of a monofunctional compound or a polyfunctional compound is used. The monofunctional compound or the polyfunctional compound is not particularly limited. For example, representative photocurable resins are exemplified below.

As a monofunctional compound of the polymerizable vinyl compound, isobornyl acrylate, isobornyl methacrylate, dicyclopentenyl acrylate, bornyl acrylate, bornyl methacrylate, 2-hydroxyethyl acrylate, 2-hydroxypropyl acrylate, propylene glycol acrylate, vinylpyrrolidone, acrylamide, vinyl acetate, styrene and the like are exemplified. As a polyfunctional compound, trimethylolpropane triacrylate, EO-modified trimethylolpropane triacrylate, ethylene glycol diacrylate, tetraethylene glycol diacrylate, polyethylene glycol diacrylate, 1,4-butanediol diacrylate, 1,6-hexanediol diacrylate, neopentyl glycol diacrylate, dicyclopentenyl diacrylate, polyester diacrylate, diallyl phthalate and the like are exemplified. One type or more of the monofunctional compounds or the polyfunctional compounds can be used alone or in the form of a mixture.

As a polymerization initiator of the vinyl compound, a photopolymerization initiator, and a thermopolymerization initiator are used. As a photopolymerization initiator, 2,2-dimethoxy-2-phenylacetophenone, 1-hydroxycyclohexyl phenyl ketone, acetophenone, benzophenone, xanthone, fluorenone, benzaldehyde, fluorene, anthraquinone, triphenylamine, carbazole, 3-methylacetophenone, Michler's ketone and the like can be representatively exemplified. It is possible to use one type of the initiators or two types or more of the initiators by combining the initiators with each other. If necessary, it is possible to use a sensitizer such as an amine compound together. As a thermopolymerization initiator, benzoyl peroxide, t-butyl peroxybenzoate, dicumyl peroxide, diisopropyl peroxydicarbonate, t-butyl peroxide, azobisisobutyronitrile and the like are representatively exemplified. The used amount of the photopolymerization initiator or the thermopolymerization initiator is preferably 0.1 to 10 weight % respectively with respect to the vinyl compound.

As an epoxy compound, hydrogenated bisphenol A diglycidyl ether, 3,4-epoxycyclohexylmethyl-3,4-epoxycyclohexane carboxylate, 2-(3,4-epoxycyclohexyl-5,5-spiro-3,4-epoxy)cyclohexane-m-dioxane, bis(3,4-epoxycyclohexylmethyl)adipate and the like are exemplified. In a case where the epoxy compound is used, it is possible to use an energy activated cationic initiator such as triphenylsulfonium hexafluoroantimonate.

If necessary, a leveling agent, a surfactant, an organic polymer compound, an organic plasticizer or the like may be added to the liquid photocurable resin.

The inorganic filler particles used in the present invention are not particularly limited as long as the inorganic filler particles are light-transmitting particles of which a difference in refractive index nd to the curable resin after curing is ±0.02 or less (preferably ±0.01 or less, more preferably ±0.075 or less, and further preferably ±0.05 or less), and a difference in Abbe number vd is ±10 or less (preferably ±5.0 or less, more preferably ±2.5 or less, and further preferably ±1.0 or less). For example, glass beads, glass powder, glass fibers, ceramic powder, ceramic fibers or the like can be used alone or used by being mixed with each other. If the difference between the light-transmitting particles and the curable resin becomes large in optical constant, transparency of a three-dimensional modeled object is lowered, due to mismatch of the refractive index to the resin.

In the light-transmitting particles, although depending on the combined resin, for example, the refractive index nd is preferably 1.40 to 1.90, 1.40 to 1.65, and 1.45 to 1.6, and particularly preferably 1.5 to 1.55, and although depending on the combined resin, for example, Abbe number vd is preferably 20 to 65, 40 to 65, and 45 to 60, and particularly preferably 50 to 55. If the refractive index nd is 1.5 to 1.55, and Abbe number vd is 50 to 55, the light-transmitting particles can be widely used since the light-transmitting is matched with a lot of resins such as a vinyl resin, an epoxy resin, and an ABS resin in optical constant. If the optical constant deviates from the above range, the optical constant which is matched with that of the curable resin after curing is unlikely to be obtained. In the light-transmitting particles, light transmittance of any wavelength is 10% or more in a range of visible rays, but from the viewpoint of enhancing the transparency of the obtained modeled object, it is preferable that average transmittance is 30% or more, 50% or more, and particularly 70% or more in a visible area (400 to 700 nm).

At the time of combining the light-transmitting particles with the curable resin, a suitable material may be selected so as to satisfy the above conditions, but particularly in the transmittance after curing, the maximum transmittance is selected so as to be preferably 10% or more, 20% or more, 30% or more, 50% or more, and 70% or more, and particularly preferably 80% or more. In the same manner, a ratio Tmax/Tmin of maximum transmittance Tmax to minimum transmittance Tmin after curing is preferably 20% or less, 8% or less, and 5% or less, and particularly preferably 3% or less.

As light-transmitting particles, glass beads, or glass particles of column-shaped rods or prism-shaped rods can be used alone or used by being combined with each other. In particular, the glass beads are excellent in liquidity since the glass beads have sphere shapes. If the light-transmitting particles are manufactured by a method such as fire polishing, surface finish of small surface roughness is possible, and the liquidity can be further enhanced. In a particle size of the glass bead, an average particle diameter D50 is preferably 0.1 to 300 μm, and particularly preferably 1 to 200 μm, and further preferably 3 to 100 μm. The maximum particle diameter of the glass bead is preferably 500 μm or less, and particularly preferably 300 μm or less, and the minimum particle diameter is preferably 0.1 μm or more, and particularly preferably 0.5 μm or more. It is possible to enhance a filling rate as the particle size of the glass bead becomes small. However, in a case where the stereolithography is used, the liquidity of the curable resin is lowered, or interfacial bubbles are unlikely to fall out. On the other hand, the filling rate is lowered as the particle size of the glass bead is large, and the light scattering is likely to be increased due to the refractive index difference. As compared with the powder glass which is manufactured by grinding or the like, the glass beads have a feature of preventing the viscosity increase of the curable resin, in case of the same added amount.

In the inorganic filler particles such as the glass beads, it is preferable that a surface thereof is processed by a silane coupling agent. If the inorganic filler particles are processed by the silane coupling agent, it is possible to enhance bonding force of the inorganic filler particles to the curable resin, and it is possible to obtain the modeled object which is further excellent in mechanical strength. Furthermore, conformability of inorganic filler particles and the curable resin becomes good, and it is possible to reduce bubbles or gaps at an interface, and it is possible to prevent the light scattering, and it is possible to enhance the transmittance. For example, it is preferable that aminosilane, epoxysilane, acrylsilane or the like is used as a silane coupling agent. The silane coupling agent may be appropriately selected depending on the used curable resin, and for example, in a case where a vinyl unsaturated compound is used as a photocurable resin, an acryl silane-based silane coupling agent is most preferable, and in a case where an epoxy compound is used, it is preferable that an epoxy silane-based silane coupling agent is used.

Furthermore, oxide nanoparticles may be added to the inorganic filler or the curable resin by a proportion of 1% or less with respect to the resin composition. $ZrO_2$, $Al_2O_3$, $SiO_2$ or the like can be used as the oxide nanoparticles. The oxide nanoparticles are particles which are smaller than a visible ray wavelength, and the light scattering is unlikely to occur.

In the glass particles such as the glass beads, the composition thereof is not limited as long as the optical constant described above is satisfied. For example, $SiO_2$—$B_2O_3$—$R'_2O$ (R' is alkaline metal element) glass, $SiO_2$—$Al_2O_3$—RO (R is alkaline earth metal element) glass, $SiO_2$—$Al_2O_3$—$R'_2O$—RO glass, $SiO_2$—$Al_2O_3$—$B_2O_3$—$R'_2O$ glass, $SiO_2$—$Al_2O_3$—$B_2O_3$—$R'_2O$—RO glass, $SiO_2$—$R'_2O$ glass, $SiO_2$—$R'_2O$—RO glass or the like can be used.

In the glass beads, it is preferable that a total amount of $Fe_2O_3$, NiO, $Cr_2O_3$, and CuO is 1 mass % or less, 0.75 mass % or less, and particularly 0.5 mass % or less among the glass composition, in order to prevent coloring.

Moreover, it is preferable that the total amount of $La_2O_3$, $Gd_2O_3$, and $Bi_2O_3$ is 20 mass % or less, 15 mass % or less, and particularly 10 mass % or less among the glass composition. If the range of the components is limited as described above, the coloring of the glass beads or the like is likely to be prevented, and it is possible to prevent the increase of the refractive index, and thereby, it is possible to easily obtain the colorless and transparent three-dimensional modeled object.

From environmental reasons, it is preferable that the total amount of lead content, antimony content, arsenic content, chlorine content, and sulfur content is 1 mass % or less, 0.5 mass % or less, and particularly 0.1 mass % or less, among the glass composition.

For example, preferable is glass containing, in terms of mass %, $SiO_2$ of 40 to 80%, $Al_2O_3$ of 0 to 30%, $B_2O_3$ of 0 to 20%, CaO of 0 to 25%, $Na_2O$ of 0 to 30% $K_2O$ of 0 to 30%, $Li_2O$ of 0 to 10%, $TiO_2$ of 0 to 15%, $Nb_2O_5$ of 0 to 20%, $WO_3$ of 0 to 20%, and F of 0 to 10%, as a composition range of glass configuring the glass particles.

Incidentally, it is significant that the optical constant of the glass particles is matched with the optical constant of the combined resin.

For example, in the vinyl resin, the refractive index nd is 1.40 to 1.60, and Abbe number vd is approximately 45 to 65, and as glass where the optical constant matched therewith is obtained, for example, it is preferable that glass containing, in terms of mass %, $SiO_2$ of 50 to 80%, $Al_2O_3$ of 0 to 30%, $B_2O_3$ of 0 to 30%, CaO of 0 to 25%, $Na_2O$ of 0 to 30%, $K_2O$ of 0 to 30%, $Li_2O$ of 0 to 10%, $TiO_2$ of 0 to 15%, $Nb_2O_5$ of 0 to 20%, $WO_3$ of 0 to 20%, and F of 0% to 10% is used. In the glass of the above composition range, the refractive index nd is 1.4 to 1.6, and Abbe number vd is 45 to 65, and it is possible to obtain the transparent three-dimensional modeled object by being combined with the vinyl resin.

The reason why the composition range is limited as described above is as follows. In the following description, "%" means mass % unless otherwise noted.

$SiO_2$ is a component forming a glass skeleton. Moreover, $SiO_2$ is a component that enables to improve chemical durability, and to prevent devitrification. $SiO_2$ is preferably 50 to 80%, and 55 to 75%, and particularly preferably 60 to 70%. If $SiO_2$ is too much, meltability is likely to be lowered. There is a concern that the manufacturing becomes difficult since softening is unlikely to be performed at the time of the forming. If $SiO_2$ is too small, the chemical durability is likely to be lowered, and there is a concern that the manufacturing becomes difficult since the glass is likely to, be devitrified.

$Al_2O_3$ is a glass stabilization component. Moreover, $Al_2O_3$ is a component that enables to improve chemical durability, and to prevent devitrification. $Al_2O_3$ is preferably 0 to 30%, and 2.5 to 25%, and particularly preferably 5 to 20%. If $Al_2O_3$ is much, the meltability is likely to be lowered. There is a concern that the manufacturing becomes difficult since the softening is unlikely to be performed at the time of the forming. If $Al_2O_3$ is small, the chemical durability is likely to be lowered, and there is a concern that the manufacturing becomes difficult since the glass is likely to be devitrified.

$B_2O_3$ is a component forming the glass skeleton. Moreover, $B_2O_3$ is a component that enables to improve chemical durability, and to prevent devitrification. $B_2O_3$ is preferably 0 to 50%, and 2.5 to 40%, and particularly preferably 5 to 30%. If $B_2O_3$ is much, the meltability is likely to be lowered. There is a concern that the manufacturing becomes difficult since the softening is unlikely to be performed at the time of the forming. If $B_2O_3$ is small, the chemical durability is likely to be lowered. There is a concern that the manufacturing becomes difficult since the glass is likely to be devitrified.

CaO is an alkaline earth, and is a component that stabilizes the glass as an intermediate among the glass. CaO is preferably 0 to 25%, and 0.5 to 20%, and particularly preferably 1 to 15%. If CaO is too much, the chemical durability is likely to be lowered, and there is a concern that the manufacturing becomes difficult since the glass is likely to be devitrified. If CaO is too small, the meltability is likely to be lowered. There is a concern that the manufacturing becomes difficult since the softening is unlikely to be performed at the time of the forming.

The total amount of MgO, SrO, BaO, and ZnO is preferably 0.1 to 50%, and 1 to 40%, and particularly preferably 2 to 30%. The components are components that are likely to lower the viscosity of the glass without greatly lowering the durability of the glass in the same manner as CaO.

$Na_2O$ is a component that lowers the viscosity of the glass, and prevents devitrification. $Na_2O$ is preferably 0 to 30%, 0.1 to 25%, and 0.5 to 20%, and particularly preferably 1 to 15%. If $Na_2O$ is too much, the chemical durability is likely to be lowered, and there is a concern that the manufacturing becomes difficult since the glass is likely to be devitrified. If $Na_2O$ is too small, the meltability is likely to be lowered, and there is a concern that the manufacturing becomes difficult since the softening is unlikely to be performed at the time of the forming.

$K_2O$ is a component that lowers the viscosity of the glass, and prevents devitrification. $K_2O$ is preferably 0 to 30%, 0.1 to 25%, and 0.5 to 20%, and particularly preferably 1 to 15%. If $K_2O$ is too much, the chemical durability is likely to be lowered, and there is a concern that the manufacturing becomes difficult since the glass is likely to be devitrified. If $K_2O$ is too small, the meltability is likely to be lowered, and there is a concern that the manufacturing becomes difficult since the softening is unlikely to be performed at the time of the forming.

$Li_2O$ is a component that lowers the viscosity of the glass, and prevents devitrification. $Li_2O$ is preferably 0 to 10%, 0.1 to 9%, and 0.5 to 7%, and particularly preferably 1 to 5%. If $Li_2O$ is too much, the chemical durability is likely to be lowered, and there is a concern that the manufacturing becomes difficult since the glass is likely to be devitrified. If $Li_2O$ is too small, the meltability is likely to be lowered, and there is a concern that the manufacturing becomes difficult since the softening is unlikely to be performed at the time of the forming.

$TiO_2$ is a component that enables to adjust the refractive index and Abbe number, and is a component that lowers the viscosity of the glass. $TiO_2$ is preferably 0 to 15%, 0.1 to 12%, and 0.5 to 10%, and particularly preferably 1 to 5%. If $TiO_2$ is too much, the refractive index tends to become large, and Abbe number tends to become small. Moreover, the coloring is likely to occur in the glass. If $TiO_2$ is too small, the refractive index tends to become small, and Abbe number tends to become large. Furthermore, the chemical durability is likely to be worsened.

$Nb_2O_5$ is a component that enables to adjust the refractive index and Abbe number. $Nb_2O_5$ is preferably 0 to 20%, 0.1 to 15%, and 0.5 to 10%, and particularly preferably 1 to 5%. If $Nb_2O_5$ is too much, the refractive index tends to become large, and Abbe number tends to become small. Moreover, the glass is likely to be devitrified. If $Nb_2O_5$ is too small, the refractive index tends to become small, and Abbe number tends to become large. Furthermore, the chemical durability is likely to be worsened.

$WO_3$ is a component that enables to adjust the refractive index and Abbe number, and is a component that lowers the viscosity of the glass. $WO_3$ is preferably 0 to 20%, 0.1 to 15%, and 0.5 to 10%, and particularly preferably 1 to 5%.

Among the glass composition, the total amount of $TiO_2$, $Nb_2O_5$, and $WO_3$ is preferably 0 to 30%, 0.1 to 25%, and 1 to 20%, and particularly preferably 3 to 15%. If the range of the components is limited as described above, the refractive index and Abbe number are likely to be adjusted, and the devitrification of the glass is likely to be prevented. Moreover, the glass of high chemical durability is likely to be obtained.

Among the glass composition, the total amount of $Nb_2O_5$ and $WO_3$ is preferably 0 to 30%, 0.1 to 25%, and 1 to 20%, and particularly preferably 2 to 10%. If the range of the components is limited as described above, the refractive index and Abbe number are likely to be adjusted, and the coloring becomes difficult. Moreover, the devitrification of the glass is likely to be prevented. Furthermore, the glass of high chemical durability is likely to be obtained.

$F_2$ is a component forming the glass skeleton. Moreover, $F_2$ is a component that enables to enhance the transmittance, particularly the transmittance of an ultraviolet range. $F_2$ is preferably 0 to 10%, 0.1 to 7.5%, and 0.5 to 5%, and particularly preferably 1 to 3%. If $F_2$ is too much, the refractive index tends to become small, and Abbe number tends to become large. Moreover, the chemical durability is likely to be worsened. Since $F_2$ has high volatility, there is a concern that the component which is sublimated at the time of manufacturing the beads is attached to the glass surface, and surface quality is worsened. If $F_2$ is too small, the refractive index tends to become large, and Abbe number tends to become small. Furthermore, the coloring of the glass is likely to occur.

In the epoxy resin, the refractive index nd is 1.50 to 1.80, and Abbe number vd is 20 to 55, and as glass where the optical constant matched therewith is obtained, for example, it is preferable that glass containing, in terms of mass %, $SiO_2$ of 20 to 70%, $Al_2O_3$ of 0 to 20%, $B_2O_3$ of 0 to 20%, CaO of 0 to 25%, $Na_2O$ of 0 to 10%, $K_2O$ of 0 to 10%, $Li_2O$ of 0 to 10%, $TiO_2$ of 0 to 15%, $Nb_2O_5$ of 0 to 20%, $WO_3$ of 0 to 20%, and F of 0 to 10% is used. In the glass of the above composition range, the refractive index nd is 1.5 to 1.8, and Abbe number vd is 20 to 55, and it is possible to obtain the transparent three-dimensional modeled object by being combined with the epoxy resin.

The reason why the composition range is limited as described above is as follows.

$SiO_2$ is a component forming a glass skeleton. Moreover, $SiO_2$ is a component that enables to improve chemical durability, and to prevent devitrification. $SiO_2$ is preferably 20 to 70%, and 30 to 65%, and particularly preferably 40 to 60%. If $SiO_2$ is too much, meltability is likely to be lowered, and there is a concern that the manufacturing becomes difficult since softening is unlikely to be performed at the time of the forming. If $SiO_2$ is too small, the chemical durability is likely to be lowered, and there is a concern that the manufacturing becomes difficult since the glass is likely to be devitrified.

$Al_2O_3$ is a glass stabilization component. Moreover, $Al_2O_3$ is a component that enables to improve chemical durability, and to prevent devitrification. $Al_2O_3$ is preferably 0 to 30%, and 2.5 to 25%, and particularly preferably 5 to 20%. If $Al_2O_3$ is much, the meltability is likely to be lowered. There is a concern that the manufacturing becomes difficult since the softening is unlikely to be performed at the time of the forming. If $Al_2O_3$ is small, the chemical durability is likely to be lowered, and there is a concern that the manufacturing becomes difficult since the glass is likely to be devitrified.

$B_2O_3$ is a component forming the glass skeleton. Moreover, $B_2O_3$ is a component that enables to improve chemical durability, and to prevent devitrification. $B_2O_3$ is preferably 0 to 50%, and 2.5 to 40%, and particularly preferably 5 to 30%. If $B_2O_3$ is much, the meltability is likely to be lowered. There is a concern that the manufacturing becomes difficult since the softening is unlikely to be performed at the time of the forming. If $B_2O_3$ is small, the chemical durability is likely to be lowered, and there is a concern that the manufacturing becomes difficult since the glass is likely to be devitrified.

CaO is a component that stabilizes the glass as an intermediate among the glass. CaO is preferably 0% to 25, and 0.5 to 20%, and particularly preferably 1 to 15%. If CaO is too much, the chemical durability is likely to be lowered, and there is a concern that the manufacturing becomes difficult since the glass is likely to be devitrified. If CaO is too small, the meltability is likely to be lowered, and there is a concern that the manufacturing becomes difficult since the softening is unlikely to be performed at the time of the forming.

The total amount of MgO, SrO, BaO, and ZnO is preferably 0.1 to 50%, and 1.0 to 40%, and particularly preferably 2 to 30%. The components are components that are likely to lower the viscosity of the glass without greatly lowering the durability of the glass in the same manner as CaO.

$Na_2O$ is a component that lowers the viscosity of the glass, and prevents devitrification. $Na_2O$ is preferably 0 to 10%, 0.1 to 7.5%, and 0.5 to 5%, and particularly preferably 1 to 2.5%. If $Na_2O$ is too much, the chemical durability is likely to be lowered, and there is a concern that the manufacturing becomes difficult since the glass is likely to be devitrified. If $Na_2O$ is too small, the meltability is likely to be lowered, and there is a concern that the manufacturing becomes difficult since the softening is unlikely to be performed at the time of the forming.

$K_2O$ is a component that lowers the viscosity of the glass, and prevents devitrification. $K_2O$ is preferably 0 to 10%, 0.1 to 7.5%, and 0.5 to 5%, and particularly preferably 1 to 2.5%. If $K_2O$ is too much, the chemical durability is likely to be lowered, and there is a concern that the manufacturing becomes difficult since the glass is likely to be devitrified. If $K_2O$ is too small, the meltability is likely to be lowered, and there is a concern that the manufacturing becomes difficult since the softening is unlikely to be performed at the time of the forming.

$Li_2O$ is a component that lowers the viscosity of the glass, and prevents devitrification. $Li_2O$ is preferably 0 to 10%, 0.1 to 9%, and 0.5 to 7%, and particularly preferably 1% to 5%. If $Li_2O$ is too much, the chemical durability is likely to be lowered, and there is a concern that the manufacturing becomes difficult since the glass is likely to be devitrified. If $Li_2O$ is too small, the meltability is likely to be lowered, and there is a concern that the manufacturing becomes difficult since the softening is unlikely to be performed at the time of the forming.

Among the glass composition, the total amount of $Na_2O$, $K_2O$, and $Li_2O$ is preferably 10% or less, 7.5% or less, 5% or less, and 2.5% or less, and particularly preferably 1% or less. If the total amount of the components is limited as described above, evaporation of the alkaline component among the glass which occurs at the time of curing the resin is likely to be prevented. Since it is possible to prevent the lowering of the chemical durability, it is possible to prevent deterioration of the epoxy resin, for example, by alkaline elution. Therefore, it is possible to easily obtain the colorless and transparent three-dimensional modeled object, and it is possible to prevent the deterioration of the obtained modeled object with the elapse of the time. Since it is possible to make a thermal expansion coefficient of the glass small, it is possible to prevent thermal contraction at the time of thermal shock or the curing.

$TiO_2$ is a component that enables to adjust the refractive index and Abbe number, and is a component that lowers the viscosity of the glass. $TiO_2$ is preferably 0 to 15%, 0.1 to 12%, and 0.5 to 10%, and particularly preferably 1 to 5%. If $TiO_2$ is too much, the refractive index tends to become large, and Abbe number tends to become small. Moreover, the glass is likely to be colored. If $TiO_2$ is too small, the refractive index tends to become small, and Abbe number tends to become large. Furthermore, the chemical durability is likely to be worsened.

$Nb_2O_5$ is a component that enables to adjust the refractive index and Abbe number. $Nb_2O_5$ is preferably 0 to 20%, 0.1 to 15%, and 0.5 to 10%, and particularly preferably 1 to 5%. If $Nb_2O_5$ is too much, the refractive index tends to become large, and Abbe number tends to become small. Moreover, the glass is likely to be devitrified. If $Nb_2O_5$ is too small, the refractive index tends to become small, and Abbe number tends to become large. Furthermore, the chemical durability is likely to be worsened.

$WO_3$ is a component that enables to adjust the refractive index and Abbe number, and is a component that lowers the viscosity of the glass. $WO_3$ is preferably 0 to 20%, 0.1 to 15%, and 0.5 to 10%, and particularly preferably 1 to 5%. If $WO_3$ is too much, the refractive index tends to become large, and Abbe number tends to become small. Moreover, the glass tends to be easily colored. If $WO_3$ is too small, the refractive index tends to become small, and Abbe number tends to become large. Furthermore, the chemical durability is likely to be worsened.

Among the glass composition, the total amount of $TiO_2$, $Nb_2O_5$, and $WO_3$ content is preferably 0 to 30%, 0.1 to 25%, and 1 to 20%, and particularly preferably 3 to 15%. If the range of the components is limited as described above, the refractive index and Abbe number are likely to be adjusted, and the devitrification of the glass is likely to be prevented. Moreover, the glass of high chemical durability is likely to be obtained.

Among the glass composition, the total amount of $Nb_2O_5$ and $WO_3$ is preferably 0 to 30%, 0.1 to 25%, and 1 to 20%, and particularly preferably 2 to 15%. If the range of the components is limited as described above, the refractive index and Abbe number are likely to be adjusted, and the coloring becomes difficult. Moreover, the devitrification of the glass is likely to be prevented. Furthermore, the glass of high chemical durability is likely to be obtained.

$F_2$ is a component forming the glass skeleton. Moreover, $F_2$ is a component that enables to enhance the transmittance, particularly the transmittance of the ultraviolet range. $F_2$ is preferably 0 to 10%, 0.1 to 7.5%, and 0.5 to 5%, and particularly preferably 1 to 3%. If $F_2$ is too much, the refractive index tends to become small, and Abbe number tends to become large. Moreover, the chemical durability is likely to be worsened. Since $F_2$ has high volatility, there is a concern that the component which is sublimated at the time of manufacturing the beads is attached to the glass surface, and surface quality is worsened. If $F_2$ is too small, the refractive index tends to become large, and Abbe number tends to become small. Furthermore, the coloring of the glass is likely to occur.

The glass particles is preferably made of glass of which the thermal expansion coefficient is preferably 20 to 100× $10^{-7}/°$ C., and 30 to 90×$10^{-7}/°$ C., and particularly preferably 40 to 80×$10^{-7}/°$ C., in a range of 30° C. to 100° C. A crack or strength deterioration due to the thermal shock is unlikely to occur as the thermal expansion coefficient of the glass is small, and it is possible to obtain the modeled object of which a contraction rate is small at the time of the curing, and dimension accuracy is high.

Next, a method for manufacturing a three-dimensional modeled object of the present invention using the resin composition described above, will be described by using the stereolithography. Here, the resin composition is as described above, and the description thereof will be omitted.

First, a liquid layer of one layer which contains a photocurable resin composition is prepared. For example, a modeling stage is mounted within a tank which is filled with the liquid photocurable resin composition, and an upper surface of the stage is positioned so as to form a desired depth (for example, approximately 0.2 mm) from a liquid surface. Thereby, it is possible to prepare the liquid layer having a thickness of approximately 0.1 to 0.2 mm on the stage.

Next, the photocurable resin is cured by irradiating the liquid layer with an active energy ray, for example, an ultraviolet laser, and a cured layer having a pattern is formed. As an active energy ray, a laser beam of visible rays, infrared rays or the like can be used, in addition to ultraviolet rays.

Subsequently, a new liquid layer containing the photocurable resin composition is prepared on the formed cured layer. For example, the modeling stage described above is lowered as a degree of one layer, and thereby, the photocurable resin is introduced onto the cured layer, and it is possible to prepare a new liquid layer.

Thereafter, a new cured layer which is continuous with the cured layer is formed by irradiating the new liquid layer prepared on the cured layer with the active energy ray.

By repeating the above operation, the cured layers are continuously stacked, and a three-dimensional modeled object is obtained. In the three-dimensional modeled object which is obtained in this way, the maximum transmittance is likely to be 10% or more, and is preferably 20% or more, 30% or more, 50% or more, and 70% or more, and particularly preferably 80% or more. Moreover, the ratio Tmax/Tmin of the maximum transmittance Tmax to the minimum transmittance Tmin is likely to be 20% or less, and is preferably 8% or less, and 5% or less, and particularly preferably 3% or less.

Subsequently, an inorganic filler of the present invention will be described.

The inorganic filler of the present invention contains the glass particles. Here, the suitable properties, the particle size, the composition and the like of the glass particle are as described above, and the description thereof will be omitted.

It is preferable that the surface of the glass particle is processed by the silane coupling agent. Here, the silane coupling agent is as described above, and the description thereof will be omitted.

The inorganic filler can be appropriately used for a three-dimensional modeling such as a stereolithography, a powder sintering method, and a fused deposition modeling (FDM) method. The inorganic filler of the present invention can be used for the filler of various resins which is formed into a normal sheet shape or a block shape. For example, the inorganic filler of the present invention can be used as a filler of thermoplastic resins such as polypropylene, polyethylene, ABS resin, polycarbonate, polyether ether ketone, polyamide, thermoplastic polyimide, polyamide imide, polyether imide, polyacetal, polyethylene terephthalate, polybutylene terephthalate, modified polyphenylene ether, polyphenylene sulfide, polysulfone and polyether sulfone, or thermocurable resins such as epoxy, polyurethane, polyimide, unsaturated polyester and silicone.

EXAMPLES

Example 1

Hereinafter, the resin composition for three-dimensional modeling according to the present invention will be described based on examples. Table 1 illustrates examples (samples I to III) of the present invention.

TABLE 1

|  | I | II | III |
|---|---|---|---|
| Mixing proportion (vol %) | | | |
| Acrylic photocurable resin | 90 | 70 | 70 |
| Glass beads A1 | 10 | 30 | |
| Glass beads A2 | | | 30 |
| Viscosity (Pa · s) | 1 | 2.7 | 2.1 |
| Tmax transmittance | 65 | 50 | 82 |
| Tmin transmittance | 50 | 37 | 62 |
| Tmax/Tmin | 1.3 | 1.4 | 1.3 |
| Knoop hardness | 15 | 30 | 30 |

First, isophorone diisocyanate, morpholine acrylamide, and dibutyltin dilaurate were heated by an oil bath. A solution in which methylhydroquinone was uniformly mixed and dissolved was put into glycerin monomethacrylate monoacrylate, was stirred and mixed, and was reacted. A propylene oxide 4-mole adduct of pentaerythritol (4 hydroxyl groups of pentaerythritol to which 1 mole of propylene oxide was respectively added) was added thereto, and was reacted, and a reaction product including urethane acrylate oligomer and morpholine acrylamide was manufactured.

Morpholine acrylamide, and dicyclopentanyl diacrylate were added to the obtained urethane acrylate oligomer and morpholine acrylamide. Furthermore, 1-hydroxycyclohexyl phenyl ketone (photopolymerization initiator) was added thereto, and a colorless and transparent acrylic photocurable resin was obtained. In the acrylic photocurable resin, the viscosity was 1 Pa·s, the refractive index nd after curing was 1.5103, Abbe number vd was 51.2, and Knoop hardness was 11.

Glass beads A1 and A2 were manufactured in the following manner. After a raw material which was blended so as to be glass containing $SiO_2$ of 50.3%, $B_2O_3$ of 7%, $Al_2O_3$ of 7.9%, $K_2O$ of 8.5%, $Sb_2O_3$ of 0.4%, $TiO_2$ of 6.6%, $Nb_2O_5$ of 0.6%, $WO_3$ of 1.4%, and $KHF_2$ of 17.3%, by mass %, was melted, and the glass was pulverized to manufacture powder glass having an average particle diameter of 5 μm. The powder was exposed to a flame of an oxygen burner, and was formed into a sphere shape. Thereafter, the glass beads A1 having the average particle diameter of 5 μm was obtained by carrying out classification. In the same manner, the powder glass having the average particle diameter of 30 μm was made into beads, and the glass beads A2 having the average particle diameter of 30 μm was obtained. As a result of measuring the optical constant of the obtained glass beads A, the refractive index nd was 1.5111, and Abbe number vd was 51.

Subsequently, the glass beads A1 and A2 were added to the acrylic photocurable resin by the proportion illustrated in Table 1, and kneading was performed by three rollers, and a paste-shaped resin in which the glass beads were homogeneously dispersed was obtained. The paste-shaped resin was poured into a modeling box with a mouth of an inside size of 30 mm×30 mm, made of Teflon (registered trademark). Thereafter, the paste-shaped resin was irradiated with the light having 500 mW and a wavelength of 364 nm, and the curing was performed at 80° C.

A plate material obtained in this way had high mechanical strength, and was excellent in transparency. Therefore, if the compositions of samples I to III are used, and the three-dimensional modeled object is manufactured by the stereolithography, it is possible to obtain the modeled object with high strength and high transparency.

In the photocurable resin and the glass beads, the refractive index nd and Abbe number vd were values measured by a precise refractive index meter (KPR-2000 manufactured by Shimadzu Corporation).

The viscosity of the photocurable resin was measured by a Brookfield viscometer (DV-3).

Regarding the transmittance, in a case where mirror polishing was performed on both surfaces of the three-dimensional modeled object by a wall thickness of 1 mm, the maximum transmission wavelength was assumed to be Tmax, and the minimum transmission wavelength was assumed to be Tmin in the transmission wavelengths of 400 nm to 800 nm.

The hardness was measured by using Knoop hardness meter under the load of 50 g.

Example 2

Table 2 illustrates an example (sample IV) of the present invention.

TABLE 2

|  | IV |
|---|---|
| Mixing proportion (vol %) | |
| Epoxy photocurable resin | 70 |
| Glass beads B | 30 |
| Viscosity (Pa · s) | 2.8 |
| Tmax transmittance | 49 |
| Tmin transmittance | 19 |
| Tmax/Tmin | 2.6 |
| Knoop hardness | 31 |

First, epoxycyclohexylmethyl, epoxycyclohexane carboxylate, butanediol diglycidyl ether, phenyl propane, trimethylolpropane triacrylate were prepared, and were stirred and mixed approximately for 1 hour. Thereafter, hexafluoroantimonate was added thereto, and an epoxy photocurable resin was manufactured. In the epoxy photocurable resin, the viscosity was 1 Pa·s, the refractive index nd after curing was 1.5713, Abbe number vd was 35.7, and Knoop hardness was 12.

Glass beads B was manufactured in the following manner. After a raw material which was blended so as to be glass containing $SiO_2$ of 53.6%, $B_2O_3$ of 4.3%, $Al_2O_3$ of 5.5%, MgO of 18.4%, CaO of 0.9%, $Na_2O$ of 0.5%, and $SO_3$ of 16.8%, by mass %, was melted, and the glass was pulverized to manufacture powder glass having the average particle diameter of 5 μm. The powder was exposed to the flame of the oxygen burner, and was formed into the sphere shape. Thereafter, the glass beads B having the average particle diameter of 5 was obtained by carrying out the classification. As a result of measuring the optical constant of the obtained glass beads B, the refractive index nd was 1.5852, and Abbe number vd was 39.

Subsequently, the glass beads B was added to the epoxy photocurable resin composition by the proportion illustrated in Table 2, and a sample was made in the same manner as Example 1, and the sample was cured. As a result, the obtained plate material had high mechanical strength, and was excellent in transparency. Therefore, if the composition of sample IV is used, and the three-dimensional modeled object is manufactured by the stereolithography, it is possible to obtain the modeled object with high strength and high transparency.

Comparative Example 1

Table 3 illustrates a comparative example (sample V) of the present invention.

TABLE 3

|  | V |
|---|---|
| Mixing proportion (vol %) | |
| Acrylic photocurable resin | 70 |
| Glass beads B | 30 |
| Viscosity (Pa · s) | 2.8 |
| Tmax transmittance | 0 |
| Tmin transmittance | 0 |
| Tmax/Tmin | 0 |
| Knoop hardness | 30 |

The glass beads B manufactured in Example 2 was added to the acrylic photocurable resin used in Example 1 by the proportion illustrated in Table 3, and a sample was made in the same manner as Example 1, and the sample was cured. As a result, the obtained plate material was not matched in refractive index, and had an opaque appearance.

Comparative Example 2

Table 4 illustrates a comparative example (sample VI) of the present invention.

TABLE 4

|  | VI |
|---|---|
| Mixing proportion (vol %) | |
| Epoxy photocurable resin | 70 |
| Glass beads C | 30 |
| Viscosity (Pa · s) | 2.0 |
| Tmax transmittance | 70 |
| Tmin transmittance | 5 |
| Tmax/Tmin | 14 |
| Knoop hardness | 30 |

Glass beads C was manufactured in the following manner. After a raw material which was blended so as to be glass containing $SiO_2$ of 52%, $B_2O_3$ of 7%, $Al_2O_3$ of 14.0%, MgO of 0.4%, CaO of 25%, SrO of 0.2%, $Na_2O$ of 0.6%, $K_2O$ of 0.1%, $TiO_2$ of 0.3%, $F_2$ of 0.2%, and $Fe_2O_3$ of 0.1%, by mass %, was melted, powder glass having the average particle diameter of 5 μm was manufactured. The powder was exposed to the flame of the oxygen burner, and was formed into the sphere shape. Thereafter, the glass beads C having the average particle diameter of 5 μm was obtained by carrying out the classification. As a result of measuring the optical constant of the obtained glass beads C, the refractive index nd was 1.5657, and Abbe number vd was 58.5.

The glass beads C was added to the epoxy photocurable resin used in Example 2 by the proportion illustrated in Table 4, and a sample was made in the same manner as Example 2, and the sample was cured. As a result, since Abbe number was not matched, the obtained plate material had the appearance which was colored with rainbow colors.

Example 4

Tables 5 and 6 illustrate examples (samples Nos. 1 to 26) of the inorganic filler particles of the present invention.

TABLE 5

|  | 1 | 2 | 3 | 4 | 5 | 6 | 7 | 8 |
|---|---|---|---|---|---|---|---|---|
| $SiO_2$ | 57.3 | 55.0 | 54.4 | 55.7 | 79.6 | 79.6 | 73.7 | 72.4 |
| $Al_2O_3$ | 16.1 | 16.1 | 15.9 | 16.3 | 2.2 | 2.2 | 2.1 | 2.1 |
| $B_2O_3$ | 17.0 | 17.0 | 16.8 | 17.2 |  |  |  | 3.1 |
| MgO |  | 0.0 | 0.0 | 0.0 |  |  |  | 1.8 |
| CaO | 1.5 | 1.5 | 1.5 | 1.5 |  |  |  |  |
| SrO | 1.7 | 1.7 | 1.7 | 1.7 |  |  |  |  |
| BaO | 0.7 | 0.7 | 0.7 | 0.7 |  |  |  |  |
| ZnO | 2.0 | 2.0 | 2.0 | 2.1 |  |  |  |  |
| $Li_2O$ |  | 0.0 | 0.0 | 1.1 |  |  |  |  |
| $Na_2O$ |  | 2.3 | 0.0 | 0.0 | 9.0 | 9.0 | 8.5 | 13.3 |
| $K_2O$ |  | 0.0 | 3.4 | 0.0 |  |  |  |  |
| $TiO_2$ | 3.6 | 3.6 | 3.6 | 3.7 | 5.8 | 5.8 | 5.5 |  |
| $Nb_2O_5$ |  |  |  |  | 2.6 | 2.6 | 2.4 | 6.4 |
| $ZrO_2$ |  |  |  |  | 0.9 | 0.9 | 0.9 | 0.9 |
| $La_2O_3$ |  |  |  |  |  |  |  |  |
| $Gd_2O_3$ |  |  |  |  |  |  |  |  |
| $Ta_2O_5$ |  |  |  |  |  |  |  |  |
| $WO_3$ |  |  |  |  |  |  | 6.9 |  |
| $Y_2O_3$ |  |  |  |  |  |  |  |  |
| $Yb_2O_3$ |  |  |  |  |  |  |  |  |
| $SnO_2$ |  |  |  |  |  |  |  |  |
| $Sb_2O_5$ | 0.1 | 0.1 | 0.1 | 0.1 |  |  |  |  |
| Si + Al + B | 90.4 | 88.1 | 87.1 | 89.2 | 81.8 | 81.8 | 75.7 | 77.6 |
| Na + K + Li | 0.0 | 2.3 | 3.4 | 1.1 | 9.0 | 9.0 | 8.5 | 13.3 |
| Ti + Nb + W | 3.6 | 3.6 | 3.6 | 3.7 | 8.4 | 8.4 | 14.9 | 6.4 |
| Nb + W | 0.0 | 0.0 | 0.0 | 0.0 | 2.6 | 2.6 | 9.4 | 6.4 |
| Ca + Mg + Zn + Sr | 5.2 | 5.2 | 5.1 | 5.3 | 0.0 | 0.0 | 0.0 | 1.8 |
| nd | 1.512 | 1.514 | 1.512 | 1.518 | 1.520 | 1.527 | 1.523 | 1.528 |
| vd | 55.2 | 55.7 | 55.8 | 55.8 | 51.6 | 49.9 | 50.5 | 51.0 |
| α30-300 | 32 | 36 | 36.3 | 37.1 | 42 |  | 43 | 48 |

TABLE 5-continued

|  | 9 | 10 | 11 | 12 | 13 | 14 | 15 |
|---|---|---|---|---|---|---|---|
| $SiO_2$ | 73.5 | 54 | 58.8 | 50.4 | 53 | 68 | 70 |
| $Al_2O_3$ | 2.1 | 13.2 | 12.8 | 4.4 | 16.3 | 6.5 | |
| $B_2O_3$ | | 1.6 | | 4 | 16.5 | 9 | 11.2 |
| MgO | | 2.9 | 8.1 | | 0.3 | | |
| CaO | | 8.6 | 12.9 | 4.6 | 3.5 | | 0.2 |
| SrO | | 12.3 | | | 3.7 | | |
| BaO | | | | 8 | 0.6 | | 1.4 |
| ZnO | 1.2 | | | | 2 | 1.5 | |
| $Li_2O$ | | | 0.2 | | 0.2 | 2.9 | |
| $Na_2O$ | 8.5 | | 0.4 | 5.5 | 0.4 | 4.5 | 9.5 |
| $K_2O$ | | | | 13.1 | | 5 | 7.3 |
| $TiO_2$ | 1.9 | 7.4 | 6.8 | 9.9 | 2.6 | 2 | 0.1 |
| $Nb_2O_5$ | 6.3 | | | | 0.8 | | |
| $ZrO_2$ | 0.9 | | | | | 0.5 | 0.2 |
| $La_2O_3$ | 2.4 | | | | | | |
| $Gd_2O_3$ | | | | | | | |
| $Ta_2O_5$ | | | | | | | |
| $WO_3$ | 3.4 | | | | | | |
| $Y_2O_3$ | | | | | | | |
| $Yb_2O_3$ | | | | | | | |
| $SnO_2$ | | | | | | | |
| $Sb_2O_5$ | | | | 0.1 | 0.1 | 0.1 | 0.1 |
| Si + Al + B | 75.5 | 68.8 | 71.6 | 58.8 | 85.8 | 83.5 | 81.2 |
| Na + K + Li | 8.5 | 0.0 | 0.6 | 18.6 | 0.6 | 12.4 | 16.8 |
| Ti + Nb + W | 11.5 | 7.4 | 6.8 | 9.9 | 3.4 | 2.0 | 0.1 |
| Nb + W | 9.7 | 0.0 | 0.0 | 0.0 | 0.8 | 0.0 | 0.0 |
| Ca + Mg + Zn + Sr | 1.2 | 23.8 | 21.0 | 4.6 | 9.5 | 1.5 | 0.2 |
| nd | 1.529 | 1.590 | 1.585 | 1.583 | 1.523 | 1.516 | 1.516 |
| vd | 52.0 | 49.0 | 52.0 | 46.3 | 57.0 | 60.0 | 64.0 |
| α30-300 | | | | | | 32 | 40 |

TABLE 6

|  | 16 | 17 | 18 | 19 | 20 | 21 | 22 | 23 | 24 | 25 | 26 | 27 |
|---|---|---|---|---|---|---|---|---|---|---|---|---|
| $SiO_2$ | 59.9 | 44.4 | 53.2 | 65.5 | 51.0 | 70.0 | 50.9 | 74.5 | 76.0 | 40.0 | 23.0 | 26.8 |
| $Al_2O_3$ | | 3.0 | 3.5 | 0.5 | 7.6 | 0.5 | 7.9 | | | | | |
| $B_2O_3$ | | | | | 7.4 | | 7.7 | 5.0 | 16.0 | 5.5 | 13.0 | 2.0 |
| MgO | | | | | | | | | | | | |
| CaO | | | 4.7 | | | | | 0.2 | | 4 | 15 | 14.4 |
| SrO | | | | 2.0 | | | | | | | | |
| BaO | | 23.8 | 13.5 | | | | | 4.5 | | 1.5 | 10 | |
| ZnO | 5.0 | 9.9 | | 7.0 | | | | | | 1 | 14 | 2 |
| $Li_2O$ | | | | 2.2 | | | | | | 6 | | 4.8 |
| $Na_2O$ | 15.0 | 11.9 | 5.2 | 4.6 | | 20.0 | | 4.0 | 3.4 | 4.0 | | 2.0 |
| $K_2O$ | | | 10.2 | 6.7 | 19.0 | | 19.3 | 5.9 | 1.9 | 5.0 | | 2.0 |
| $TiO_2$ | | | 9.6 | 11.5 | 8.1 | 7.8 | 4.9 | 3.0 | 2.7 | 0.4 | | 13.0 |
| $Nb_2O_5$ | | | | | | | 4.9 | 2.0 | | 26.0 | 3.0 | 11.5 |
| $ZrO_2$ | | 4 | | | | | 0.5 | 0.3 | | 6.0 | 4.0 | 9.5 |
| $La_2O_3$ | | 3 | | | 1.4 | | 0.2 | | | | 14 | 12 |
| $Gd_2O_3$ | | | | | | | | | | 0.6 | | |
| $Ta_2O_5$ | | | | | | | | | | | | |
| $WO_3$ | | | | | | | | | | | 4 | |
| $Bi_2O_3$ | 20.0 | | | | | | | | | | | |
| $Yb_2O_3$ | | | | | | | | | | | | |
| F | | | | | 5.4 | 1.6 | 3.5 | 0.5 | | | | |
| $Sb_2O_5$ | 0.1 | | 0.1 | | 0.1 | 0.1 | 0.2 | 0.1 | | | | |
| Si + Al + B | 59.9 | 47.4 | 56.7 | 66.0 | 66.0 | 70.5 | 66.5 | 79.5 | 92.0 | 45.5 | 36.0 | 28.8 |
| Na + K + Li | 15.0 | 11.9 | 15.4 | 13.5 | 19.0 | 20.0 | 19.3 | 9.9 | 5.3 | 15.0 | 0.0 | 8.8 |
| Ti + Nb + W | 0.0 | 0.0 | 9.6 | 11.5 | 8.1 | 7.8 | 9.8 | 5.0 | 2.7 | 26.4 | 7.0 | 24.5 |
| Nb + W | 0.0 | 0.0 | 0.0 | 0.0 | 0.0 | 0.0 | 4.9 | 2.0 | 0.0 | 26.0 | 7.0 | 11.5 |
| Ca + Mg + Zn + Sr | 5.0 | 9.9 | 4.7 | 9.0 | 0.0 | 0.0 | 0.0 | 0.2 | 0.0 | 5.0 | 29.0 | 16.4 |
| nd | 1.557 | 1.589 | 1.586 | 1.576 | 1.529 | 1.530 | 1.548 | 1.528 | 1.496 | 1.679 | 1.721 | 1.795 |
| vd | 44.6 | 52.2 | 40.4 | 44.0 | 49.0 | 49.1 | 45.5 | 55.5 | 59.0 | 38.6 | 45.0 | 33.0 |
| α30-300 | 95 | | | | | 98 | | | | 36 | 92 | |

Each of samples was manufactured in the following manner. First, after a raw material which was blended so as to have the composition of the table was melted, and the glass was pulverized to manufacture powder glass having the average particle diameter of 5 μm. The powder was exposed to the flame of the oxygen burner, and was formed into the sphere shape. Thereafter, the bead-shaped sample having the average particle diameter of 5 μm was obtained by carrying out the classification.

As a result of measuring the optical constant of the obtained samples, in samples Nos. 1 to 15, 17, and 20 to 24, the refractive indexes nd were 1.496 to 1.59, and Abbe numbers vd were 45.5 to 64.0, and the samples had the optical constant which was matched with that of the vinyl resin. In samples Nos. 5 to 12, 16 to 22, and 25 to 27, the refractive indexes nd were 1.520 to 1.795, and Abbe numbers vd were 33.0 to 52.2, and the samples had the optical constant which was matched with that of the epoxy resin. In samples Nos. 1 to 5, 7 to 9, 11, 13, 14, 17, and 23, the refractive indexes nd were 1.512 to 1.590, and Abbe numbers vd were 50.5 to 60.0, and the samples had the optical constant which was matched with that of the ABS resin.

The thermal expansion coefficient was measured by DILATO METER.

INDUSTRIAL APPLICABILITY

In the resin composition for three-dimensional modeling of the present invention, the optical constant of the glass beads is matched with that of the curable resin composition after curing, and if the three-dimensional modeled object is manufactured by using the stereolithography, the powder sintering method or the like, it is possible to obtain the modeled object with high transparency.

Since the optical constant of the inorganic filler particles of the present invention is matched with that of the curable resin, it is possible to obtain the transparent resin modeled body.

The invention claimed is:

1. A resin composition for three-dimensional modeling, comprising a curable resin and inorganic filler particles,
wherein the inorganic filler particles are light-transmitting particles of which a difference in refractive index, nd, to the curable resin after curing is ±0.02 or less, and a difference in Abbe number, vd, to the curable resin after curing is ±10 or less, and
wherein the light-transmitting particles are glass particles containing $TiO_2$ of 0.1 to 15% and $Nb_2O_5$ of 0.1 to 20% in terms of mass %.

2. The resin composition for three-dimensional modeling including the curable resin and the inorganic filler particles according to claim 1,
wherein maximum transmittance Tmax after curing is 10% or more.

3. The resin composition for three-dimensional modeling including the curable resin and the inorganic filler particles according to claim 1,
wherein a ratio Tmax/Tmin of maximum transmittance Tmax to minimum transmittance Tmin after curing is 20 or less.

4. The resin composition for three-dimensional modeling according to claim 1,
wherein the curable resin is a liquid photocurable resin.

5. The resin composition for three-dimensional modeling according to claim 1,
wherein the refractive index, nd, of the light-transmitting particles is 1.40 to 1.90, and the Abbe number, vd, of the light-transmitting particles is 20 to 65.

6. The resin composition for three-dimensional modeling according to claim 1,
wherein the light-transmitting particles are glass beads.

7. The resin composition for three-dimensional modeling according to claim 6,
wherein the glass beads having a glass composition in which a total amount of $Fe_2O_3$, NiO, $Cr_2O_3$, and CuO is 1 mass % or less are used.

8. The resin composition for three-dimensional modeling according to claim 1,
wherein the light-transmitting particles are glass particles containing, in terms of mass %, $SiO_2$ of 40 to 80%, $Al_2O_3$ of 0 to 30%, $B_2O_3$ of 0 to 20%, CaO of 0 to 25%, $Na_2O$ of 0 to 30%, $K_2O$ of 0 to 30%, $Li_2O$ of 0 to 10%, $TiO_2$ of 0.1 to 15%, $Nb_2O_5$ of 0.1 to 20%, $WO_3$ of 0 to 20%, and F of 0 to 10%.

9. A method for manufacturing a three-dimensional modeled object comprising:
selectively irradiating a liquid layer containing a resin composition with an active energy ray to form a cured layer having a pattern; and
forming a new liquid layer on the cured layer and thereafter irradiating the new liquid layer with an active energy ray to form a new cured layer having a pattern continuous with the cured layer,
stacking of cured layers being repeated to obtain a three-dimensional modeled object,
wherein as the resin composition, a resin composition for three-dimensional modeling according to claim 1 is used.

* * * * *